United States Patent [19]

Buhler et al.

[11] Patent Number: 5,156,688
[45] Date of Patent: Oct. 20, 1992

[54] THERMOELECTRIC DEVICE

[75] Inventors: Steven A. Buhler, Redondo Beach; Parviz P. Mazdiyasni, Brea; Igor Abramov, Redondo Beach, all of Calif.

[73] Assignee: Xerox Corporation

[21] Appl. No.: 710,414

[22] Filed: Jun. 5, 1991

[51] Int. Cl.⁵ .............................................. H01L 35/28
[52] U.S. Cl. ..................................... 136/211; 136/212; 136/225; 62/3.2
[58] Field of Search ...................... 62/3.1, 3.2, 3.3, 3.7; 136/211, 212, 225, 227, 239, 240

[56] References Cited

U.S. PATENT DOCUMENTS

| | | | |
|---|---|---|---|
| 2,402,663 | 6/1946 | Ohl | 62/3.2 |
| 2,955,145 | 10/1960 | Schrewelius | 136/240 |
| 2,984,077 | 5/1961 | Gaskill | 62/3 |
| 3,075,360 | 1/1963 | Elfving et al. | 62/3.2 |
| 3,284,245 | 11/1966 | Nottage et al. | 136/212 |
| 3,715,288 | 2/1973 | Risgin | 204/38 A |
| 4,018,625 | 4/1977 | Tinti | 136/225 |
| 4,465,894 | 8/1984 | Reyes | 136/225 |
| 4,489,742 | 12/1984 | Moore et al. | 136/203 |
| 4,500,741 | 2/1985 | Morimoto et al. | 136/211 |
| 4,558,342 | 12/1985 | Sclar | 357/30 |
| 4,971,632 | 11/1990 | Rowe | 136/212 |

Primary Examiner—Albert J. Makey
Assistant Examiner—William C. Doerrler

[57] ABSTRACT

A new and improved semiconductor thermoelectric device which could be used either as a thermoelectric cooler or as a thermopile heat sensor with high output voltage. This invention comprises an array of thermocouples fabricated on a semiconductor substrate. The thermocouples comprise segments of tantalum and segments of conductively doped polysilicon as two electric conductor materials of different thermoelectric properties which are buried between two layers of oxide. A layer of metal as a heat collector covers the surface of the thermopile and distributes heat from a nearby heat source.

8 Claims, 2 Drawing Sheets

THERMOELECTRIC DEVICE

BACKGROUND OF THE INVENTION

This invention relates generally to thermoelectric coolers and thermopile heat sensors fabricated on a micro-circuit.

The Peltier effect causes an absorption or liberation of heat when a current flows across the junction of two unlike metals. If the current flows in the same direction as the current at the hot junction in a thermoelectric circuit, heat is absorbed; if it flows in the same direction as the current at the cold junction of the thermoelectric circuit, heat is liberated.

Traditionally, the thermoelectric (T.E.) coolers are made with a p-type and an n-type conductor sandwhiched between two plates. With passage of direct current through the assembly, one of the plates would heat up while the other would cool down. The TE assembly is therefore of a hydrid type, requiring several assembly steps.

The fabrication of the thermopile heat sensors in which segments of alternately different metals are connected to form a series of thermocouple hot and cold junctions is well known. In order to measure the temperature, one junction which is exposed to heat receives the heat and a different junction which has one segment of metal in common with the heated junction is kept at a constant temperature. The temperature difference between the two junctions is measured by detecting a thermoelectromotive force generated by this temperature difference. This is known as the Seebeck effect. The plurality of the thermocouples in a thermopile helps to amplify the voltage difference for a more precise measurement.

Further advantages of the invention will become apparent as the following description proceeds.

SUMMARY OF THE INVENTION

It is an object of this invention to provide a thermoelectric device which can be manufactured using established micro-circuit fabrication processes.

The thermoelectric device of this invention comprises a plurality of thermocouples composed of alternating segments of a first conductor with a first thermoelectric property and a second conductor with a second thermoelectric property. The segments are connected in series in a manner that one of the segments of the first conductor is connected at one end to one of the segments of the second conductor to form a first junction, and the other end of the one segment of the first conductor is connected to one end of another one of the segments of the second conductor to form a second junction. The thermocouples are buried between two layers of oxide. One of the oxide layers is located between the plurality of thermocouples and a layer of metal with plurality of heat transfer locations. The other layer of oxide is located between the plurality of thermocouples and a substrate. The oxide layers have a plurality of thin portions to provide heat passages between the layers and have a plurality of thick portions to prevent the heat transfer between the layers. Electric contact means which are isolated from the metal layer are operably connected to the thermocouples.

DESCRIPTION OF THE INVENTION

Figure 1:
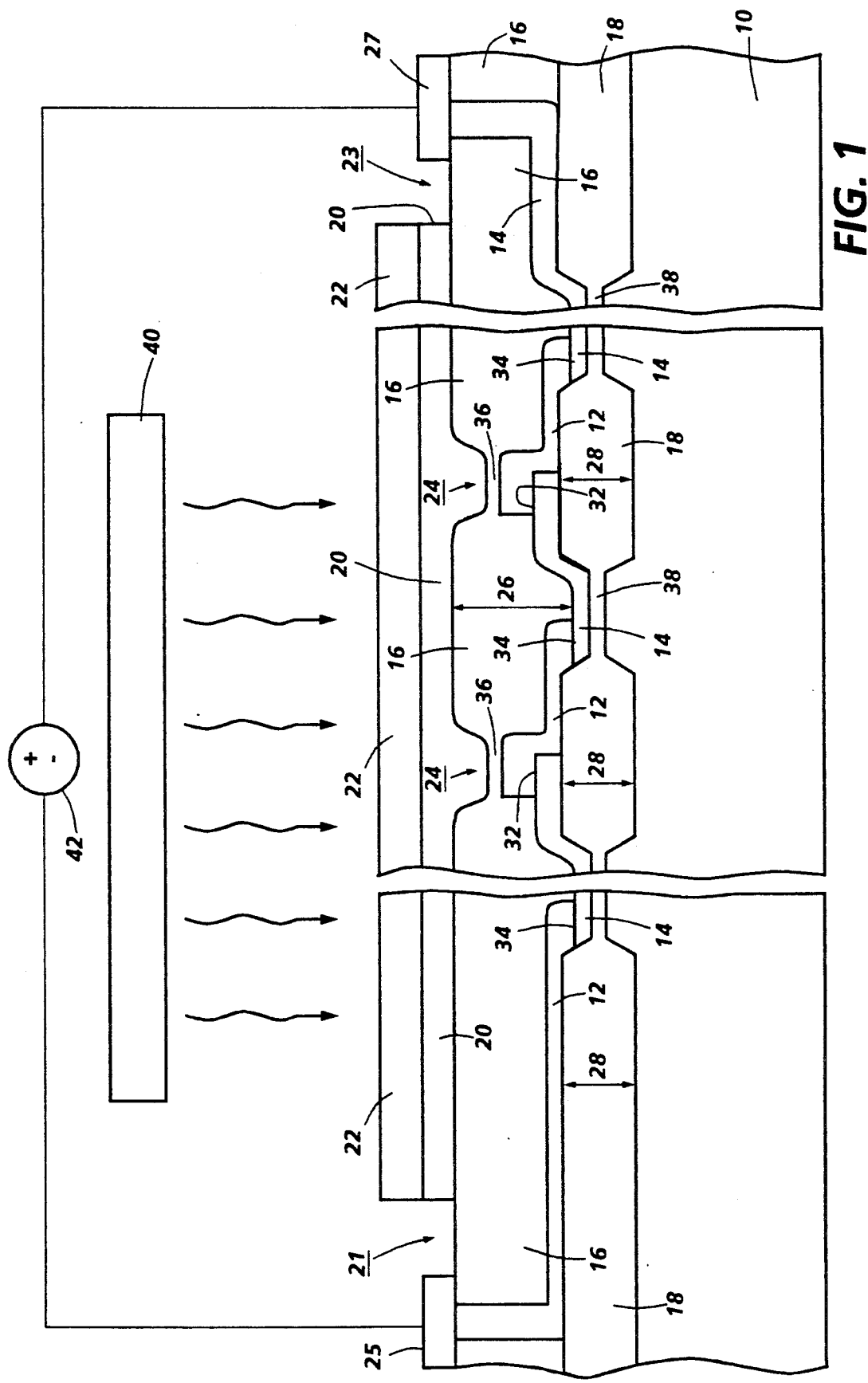
FIG. 1 is a view of a thermopile device.

Referring to FIG. 1, there is shown a thermoelectric device of this invention used as a thermopile heat sensor. The thermopile comprises an array of thermocouples, which are composed of strips of two electric conductor materials of different thermoelectric properties such as tantalum 12 and polysilicon 14 connected to each other in series. One end of each tantalum strip 12 is connected to one end of a polysilicon strip 14 forming one of the hot junctions 32 of the thermocouples. The other end of the same tantalum strip 12 is connected to the end of a different polysilicon strip 14 to form one of the cold junctions 34 of the thermocouples.

The thermocouples are buried between a first layer of oxide 18 at the bottom and a second layer of oxide 16 at the top. The first and second are referred to the oxide layers based on priority of the process steps. A layer of metal as a heat collector 20, which in this embodiment is aluminum, covers the second layer of oxide 16.

The heat collector 20 is positioned to face a heat source 40 and has a plurality of heat transferring locations 24 which are located above the hot junctions 32. This layer 20 is etched and removed at two areas 21 and 23 to provide two isolated pieces of aluminum contacts 25 and 27 for electrical connections. Preferably one tantalum segment 12 from one of the endmost thermocouples of the series and one polysilicon segment 14 from one of the other endmost thermocouples of the series are extended to have electrical contacts with the aluminum contacts 25 and 27 for electrical continuity. The surface of the heat collector 20, which is facing the heat source 40, is covered by a blacking compound 22. The blacking The blacking compound 22 keeps the light from being reflected back to the heat source by the reflective surface of the heat collector 20.

The first layer of oxide 18, which is located between the thermocouples and the substrate 10, has thin portions 38 and thick portions 28 formed by standard semiconductor processing techniques. The thin portions 38 are located between cold junctions 34 and the substrate 10 to provide a passage for the heat to be transferred from the cold junctions 34 to the substrate 10. The thick portions 28 are located between hot junctions 32 and the substrate 10 to prevent the heat transfer from the hot junctions 32 to the substrate 10.

The second layer of oxide 16, which is located between the thermocouples and the heat collector 20, also has thin portions 36 and thick portions 26 formed by standard semiconductor processing techniques. The thin portions 36 are located between heat transferring locations 24 and hot junctions 32 to provide a passage for the heat to be transferred from the heat collector 20 to the hot junctions 32. The thick portions 26 are located between cold junctions 34 and the heat collector 20 to prevent the heat transfer from the heat collector 20 to the cold junctions 34.

In operation, the infrared heat generated by the heat source 40 heats up the blacking compound 22. This layer 22 conveys the received heat from the heat source 40 to the heat collector 20. The thick portions 26 of the oxide prevent the heat in the aluminum layer 20 from penetrating through the Oxide layer. Therefore, the heat in the aluminum 20 moves to the heat transferring locations 24 which are above the thin portions 36 of the oxide layer. The heat transferring locations 24 concentrate the heat through the thin portions 36 of the oxide onto the hot junctions 32.

The heat from the hot junctions 32 will be transferred by the thermopile to the cold junctions 34. The cold junctions 34 sink the heat into the substrate 10 through the thin portions 38 of the first layer of oxide 16. By sinking the heat into the substrate 10, the temperature of the cold junctions 34 stays similar to the temperature of the substrate 10. This temperature difference will cause a voltage difference between the hot junctions 32 and the cold junctions 34. The plurality of the thermocouples amplifies the voltage difference and provides a substantially higher output voltage. The output voltage could be measured by connecting a voltmeter 42 to the two aluminum contacts 25 and 27.

The structure described in this thermopile embodiment is capable of measuring the temperature of a heat source without having a physical contact with the heat source. In addition, it is possible to process the thermopile of this invention with other smart electronics on the same silicon wafer. The materials used for making this device are common materials used in silicon wafer processing. In this design, using the minimal geometry of the device allowed by the design rule, the numbers of junctions on a chip could be in the range of 100,000. Thus, significant amplification of small signals is possible.

Figure 2:
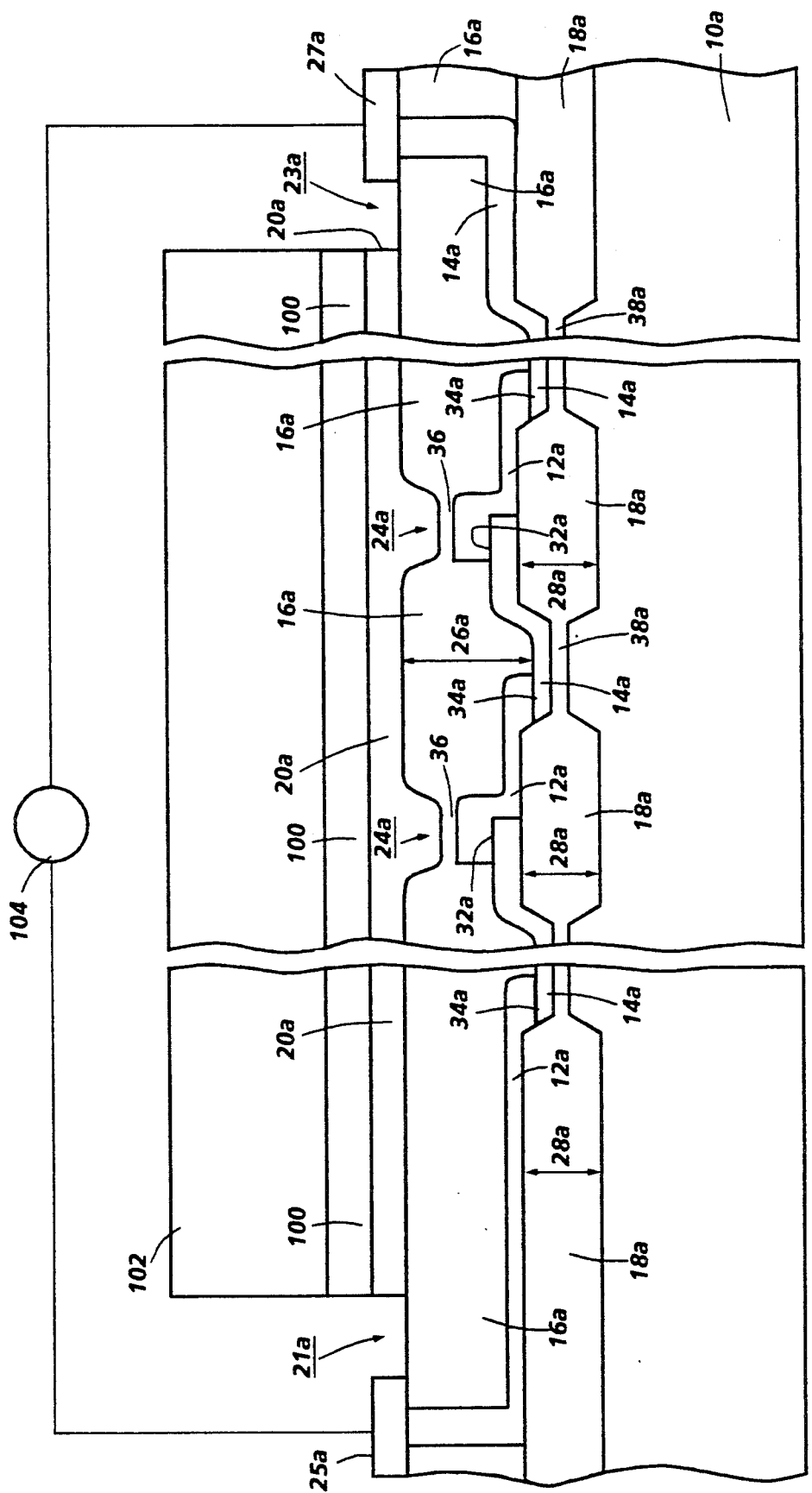
FIG. 2 is a view of a thermoelectric cooler.

FIG. 2 shows a different use of the device described in the embodiment of FIG. 1. Those elements which are the same as disclosed in the description of FIG. 1 are designated by the same reference numerals, only with an "a" affixed thereto. The device in FIG. 2 is a thermoelectric cooler which has the same structure as the device in FIG. 1 except the thermoelectric cooler does not have the blacking compound used in the thermopile structure. Conversely to the embodiment of FIG. 1, in this thermoelectric cooler embodiment, the junctions 32a are referred to as cold junctions and the junctions 34a are referred to as hot junctions. Also, a current source 104 is connected to the aluminum contacts 25 and 27 supplying electric current flow to the junctions of the thermocouples. In addition, the thermoelectric cooler shown in FIG. 2 is soldered with a layer of solder 100 to a heat source 102. The combination of the soldered thermoelectric cooler chip and heat source which in this embodiment is a laser diode chip is commonly referred to in the industry as a "flip chip".

It should be noted, since aluminum cannot be readily soldered to other metals, it may be necessary to provide intermediate metallization layer or layers between the aluminum layer 20a and solder layer 100 in order to facilitate their mutual adhesion and bonding. For example, such layer or layers can be nickel or copper deposited via electro- or electro-less plating process. These layers can serve as intermediaries only and do not appreciably affect either laser chip bonding operation or thermal performance of the assembly. Thus these layers are not shown in this Figure.

Furthermore, if other types of bonding are selected for laser chip to carrier attachment, the intermediary layers and the solder layer itself may become unnecessary. For instance, if ultrasonic bonding is used, the aluminum on the cooling strips can bond readily with metal electrodes on the laser chip, provided they are made of a suitable material themselves.

The laser diode 102 could be connected to a power supply not shown either independently or through the aluminum layer 20a. If the latter connection is used, a voltage source will be connected to the aluminum layer 20a directly. In this case, the aluminum layer 20a not only cools the laser diode it also supplies electrical power to the laser diode. This type of construction allows the set of two chips to be placed in one package using electrical contacts 25, 27 and the other associated contacts for only the cooler chip.

In operation, the heat source 102 heats up the aluminum layer 20a through the layer of solder 100. The thick portions 26a of the oxide prevent the heat in the aluminum layer 20a from penetrating through the Oxide layer. Therefore, the heat in the aluminum layer 20a moves to the heat transferring locations 24a which are above the thin portions 36a of the oxide layer. The heat transferring locations 24a concentrate the heat through the thin portions 36a of the oxide onto the cold junctions 32a.

Based on Peltier effect, if an electric current flows in the same direction as the current at the cold junctions 32a in a thermoelectric circuit of two metals, heat is absorbed. Therefore, the cold junctions 32a absorb the heat from the heat transferring locations 24a through the thin portions 36a of the second layer of the oxide 16a. This process cools the aluminum layer 20a and the adjacent area to the aluminum, thus cooling the heat source 102. By adjusting the electric current flow, the aluminum layer 20a and the heat source 102 could be cooled to a desired temperature.

The absorbed heat by the cold junctions 32a will be transferred to the hot junctions 34a to be liberated. The flow of an electric current at the hot junctions 34a in the same direction as the current in a thermoelectric circuit of two metals, will cause the hot junctions to liberate the heat. Passing through the thin portions 38a of the oxide, the liberated heat from the hot junctions sinks into the silicon substrate 10a. The thick portions 28a of the oxide prevent the heat from the substrate 10a from affecting the cold junctions 32a.

The thermoelectric cooler described in this embodiment can be processed in plurality of strips on one silicon chip. Each thermoelectric cooler strip can be bonded to a different laser diode stripe for cooling the respective laser diode stripe. Using the minimal geometry devices, a very large number of thermoelectric junctions can be placed in a small area, thus facilitating efficient and uniform heat removal from the active circuitry. In addition, the thermoelectric cooler of this invention could be incorporated on the same chip as the controller for the laser diode, or it could be constructed on a separate substrate which would be in thermal contact with the device being controlled.

It should also be noted that the laser in the above paragraph can be oriented at 90 degress relative to the cooler chip from the orientation shown on FIG. 2, in which each laser diode stripe is located above one of the heat transferring locations. At this orientation, each heat transferring location along with the associated hot and cold junctions are extended along the length of the laser stripe. If desired, the aluminum layer and thermocouple associated with each laser diode stripe can be isolated from the aluminum layer and thermocouple associated with each of the other laser diode stripes in order to provide separate cooling strip for each laser stripe.

What is claimed is:

1. A semi-conductor thermoelectric device, comprising:

a plurality of thermocouples having a first junction and a second junction;

a layer of metal for receiving heat from a heat source;

a substrate;

a first layer of oxide located between said plurality of thermocouples and said substrate;

a second layer of oxide located between said plurality of thermocouples and said layer of metal; said second layer of oxide between said second junction and said layer of metal having a substantially greater thickness than the thickness of said second layer of oxide between said first junction and said layer of metal, whereby said thicker portions of said second layer of oxide prevent the heat transfer from said layer of metal to said second junction and said thinner portions of said second layer of oxide provide transfer of heat to said first junction from said layer of metal; and said first layer of oxide between said first junction and said substrate having a substantially greater thickness than the thickness of said first layer of oxide between said second junction and said substrate, whereby said thicker portions of said first layer of oxide prevent the heat transfer from said first junction to said substrate and said thinner portions of said first layer of oxide provide transfer of heat from said second junction to said substrate.

2. The thermoelectric device of claim 1, wherein said layer of metal has a plurality of heat transferring locations for concentrating the heat onto said first junctions, and each one of said plurality of heat transferring locations is located adjacent to one of said first junctions, said thinner portions of said second layer being located between said metal layer heat transferring locations and said first junctions.

3. The thermoelectric device of claim 1, wherein said layer of metal is covered by a blacking material to prevent the absorbed heat from being reflected back to the heat source by the reflective effect of the surface of said layer of metal.

4. The thermoelectric device of claim 1 further comprising:

electric contact means operably connected to said thermocouples and being isolated from said layer of metal; and a voltmeter connected to said electric contact means whereby said thermoelectric device is a thermopile and said first junction is a hot junction and said second junction is a cold junction.

5. The thermoelectric device of claim 1 further comprising:

a plurality of thermocouples comprising alternating segments of a first conductor with a first thermoelectric property and a second conductor with a second thermoelectric property; and said segments being connected in series in a manner that one of said segments of said first conductor is connected at one end to one of said segments of said second conductor to form a first junction, and the other end of said one segment of said first conductor is connected to one end of another one of said segments of said second conductor to form a second junction.

6. The thermoelectric device of claim 5, wherein said first conductor is tantalum and said second conductor is polysilicon.

7. The thermoelectric device of claim 5, wherein said layer of metal is Aluminum.

8. The thermoelectric device of claim 1 further comprising:

electric contact means operably connected to said thermocouples and being isolated from said layer of metal; and a current source is connected to said electric contact means whereby said thermoelectric device is a thermoelectric cooler and said first junction is a cold junction and said second junction is a hot junction.

* * * * *